(12) United States Patent
Doczy et al.

(10) Patent No.: US 7,192,856 B2
(45) Date of Patent: Mar. 20, 2007

(54) FORMING DUAL METAL COMPLEMENTARY METAL OXIDE SEMICONDUCTOR INTEGRATED CIRCUITS

(75) Inventors: Mark Doczy, Beaverton, OR (US); Lawrence D. Wong, Beaverton, OR (US); Valery M. Dubin, Portland, OR (US); Justin K. Brask, Portland, OR (US); Jack Kavalieros, Portland, OR (US); Suman Datta, Beaverton, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 11/037,860

(22) Filed: Jan. 18, 2005

(65) Prior Publication Data

US 2006/0160342 A1    Jul. 20, 2006

(51) Int. Cl.
  *H01L 21/3205* (2006.01)
  *H01L 21/4763* (2006.01)
(52) U.S. Cl. ..................... 438/585; 438/199
(58) Field of Classification Search ............... 438/199, 438/233, 275, 585, 926
See application file for complete search history.

(56) References Cited

U.S. PATENT DOCUMENTS

| 6,197,688 | B1 * | 3/2001 | Simpson ..................... 438/678 |
| 2004/0192037 | A1 * | 9/2004 | Barns .......................... 438/687 |
| 2005/0245036 | A1 * | 11/2005 | Datta et al. ................. 438/287 |

* cited by examiner

*Primary Examiner*—Phuc T. Dang
(74) *Attorney, Agent, or Firm*—Trop, Pruner & Hu, P.C.

(57) ABSTRACT

Complementary metal oxide semiconductor metal gate transistors may be formed by depositing a metal layer in trenches formerly inhabited by patterned gate structures. The patterned gate structures may have been formed of polysilicon in one embodiment. The trenches may be filled with metal by surface activating using a catalytic metal, followed by electroless deposition of a seed layer followed by superconformal filling bottom up.

20 Claims, 4 Drawing Sheets

FORMING DUAL METAL COMPLEMENTARY METAL OXIDE SEMICONDUCTOR INTEGRATED CIRCUITS

BACKGROUND

The present invention relates to methods for making semiconductor devices, in particular, semiconductor devices with metal gate electrodes.

MOS field-effect transistors with very thin gate dielectrics made from silicon dioxide may experience unacceptable gate leakage currents. Forming the gate dielectric from certain high dielectric constant (K) dielectric materials, instead of silicon dioxide, can reduce gate leakage. As used herein, high-k dielectric means having a dielectric constant higher than 10. When, however, a high-k dielectric film is initially formed, it may have a slightly imperfect molecular structure. To repair such a film, it may be necessary to anneal it at a relatively high temperature.

Because such a high-k dielectric layer may not be compatible with polysilicon, it may be desirable to use metal gate electrodes in devices that include high-k gate dielectrics. When making a CMOS device that includes metal gate electrodes, it may be necessary to make the NMOS and PMOS gate electrodes from different materials. A replacement gate process may be used to form gate electrodes from different metals. In that process, a first polysilicon layer, bracketed by a pair of spacers, is removed selectively to a second polysilicon layer to create a trench between the spacers. The trench is filled with a first metal. The second polysilicon layer is then removed, and replaced with a second metal that differs from the first metal.

Thus, there is a need for alternate ways to form replacement metal gate electrodes.

Figure 1:
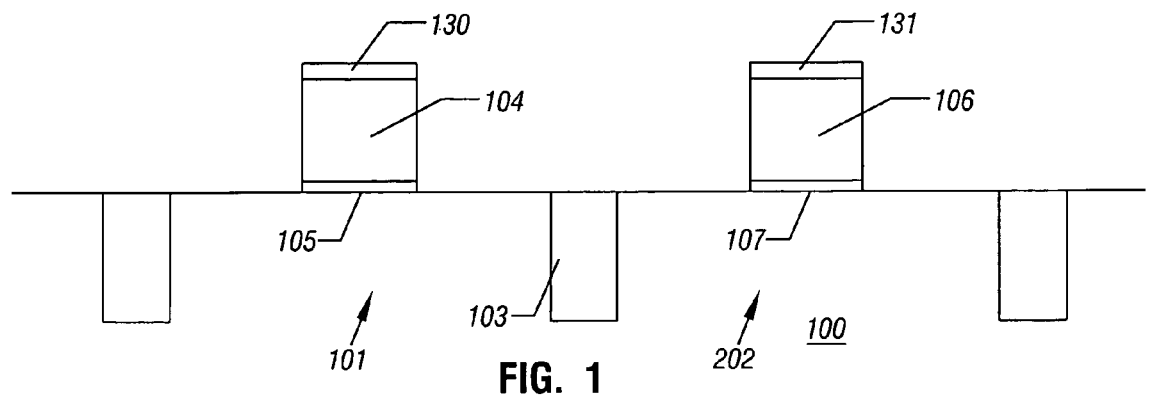
FIGS. 1–10 represent cross-sections of structures that may be formed when carrying out an embodiment of the method of the present invention.
Figure 2:
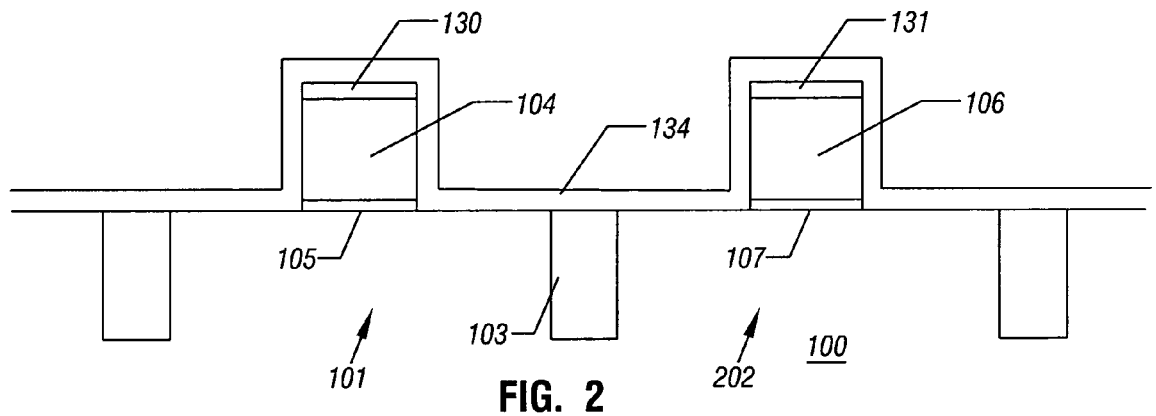

Features shown in these figures are not intended to be drawn to scale.

DETAILED DESCRIPTION

FIGS. 1–10 illustrate structures that may be formed, when carrying out an embodiment of the method of the present invention. Initially, a high-k gate dielectric layer 105, 107, a sacrificial metal layer (not shown), and a sacrificial layer 104, 106 are formed and patterned on substrate 100, generating the FIG. 1 structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Some of the materials that may be used to make high-k gate dielectric layer 105, 107 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide and aluminum oxide. Although a few examples of materials that may be used to form high-k gate dielectric layer are described here, that layer may be made from other materials that serve to reduce gate leakage. The layer has a dielectric constant higher than 10 and from 15 to 25 in one embodiment of the present invention.

High-k gate dielectric layer may be formed on substrate 100 using a conventional deposition method, e.g., a conventional chemical vapor deposition ("CVD"), low pressure CVD, or physical vapor deposition ("PVD") process. Preferably, a conventional atomic layer CVD ("ALD") process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 107. The CVD reactor should be operated long enough to form a layer with the desired thickness. In most applications, high-k gate dielectric layer 107 may be less than about 60 Angstroms thick, for example, and, in one embodiment, between about 5 Angstroms and about 40 Angstroms thick.

A sacrificial metal layer (not shown) may be formed over the dielectric layer. The sacrificial metal layer may be any metal that is capable of withstanding high temperatures (greater than 450° C.) without reaction with overlying materials. As one example, the sacrificial metal layer may be formed of titanium nitride. In one embodiment, the layer may be formed by sputtering. In another embodiment, the layer may be formed by atomic layer deposition.

After a high-k gate dielectric layer is formed on substrate 100, a sacrificial layer 104, 106 is formed on high-k gate dielectric layers 105, 107, respectively. In this embodiment, a hard mask layer 130, 131 is then formed on the sacrificial layer 104, 106. The sacrificial layer 104, 106 may comprise polysilicon and may be deposited on sacrificial metal layer using a conventional deposition process. Sacrificial layer 104, 106 may be, for example, between about 100 and about 2,000 Angstroms thick, and, in one embodiment, between about 500 and about 1,600 Angstroms thick.

Hard mask layer 130, 131 may comprise silicon nitride between about 100 and about 1000 Angstroms thick, for example, and between about 200 and about 350 Angstroms thick in one embodiment. Hard mask layer 130, 131 may be formed on sacrificial layer.

Conventional wet or dry etch processes may be used to remove unprotected parts of hard mask layer, sacrificial metal layer and sacrificial layer. In this embodiment, after those layers have been etched, exposed part of high-k gate dielectric layer is removed.

Although exposed part of high-k gate dielectric layer may be removed using dry or wet etch techniques, it may be difficult to etch that layer using such processes without adversely affecting adjacent structures. It may be difficult to etch high-k gate dielectric layer selectively to the underlying substrate using a dry etch process, and wet etch techniques may etch high-k gate dielectric layer isotropically—undercutting overlying sacrificial layers 104, 106 in an undesirable fashion.

To reduce the lateral removal of high-k gate dielectric layer, as exposed part of that layer is etched, exposed part of high-k gate dielectric layer may be modified to facilitate its removal selectively to covered part of that layer. Exposed part may be modified by adding impurities to that part of high-k gate dielectric layer after sacrificial layer has been etched. A plasma enhanced chemical vapor treatment ("PECVT") process may be used to add impurities to exposed part of high-k gate dielectric layer. In such a PECVT process, a halogen or halide gas (or a combination of such gases) may be fed into a reactor prior to striking a plasma. The reactor should be operated under the appropriate conditions (e.g., temperature, pressure, radio frequency, and power) for a sufficient time to modify exposed part to ensure that it may be removed selectively to other materials. In one embodiment, a low power PECVT process, e.g., one taking place at less than about 200 Watts, is used.

In one embodiment, hydrogen bromide ("HBr") and chlorine ("$Cl_2$") gases are fed into the reactor at appropriate flow rates to ensure that a plasma generated from those gases will modify exposed part in the desired manner. Between about 50 and about 100 Watts wafer bias (for example, about 100 Watts) may be applied for a sufficient time to complete the desired transformation of exposed part. Plasma exposure lasting less than about one minute, and perhaps as short as 5 seconds, may be adequate to cause that conversion.

After exposed part has been modified, it may be removed. The presence of the added impurities enables that exposed part to be etched selectively to covered part. In one embodiment, exposed part is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid may contain between about 75% and about 95% $H_3PO_4$ by volume. An etch process that uses such an acid may, for example, take place at between about 140° C. and about 180° C., and, in one embodiment, at about 160° C. When such an acid is used, the exposure step may last between about 30 seconds and about 5 minutes—and for about one minute for a 20 Angstrom thick film.

FIG. 1 represents an intermediate structure that may be formed when making a complementary metal oxide semiconductor ("CMOS"). That structure includes first part 101 and second part 102 of substrate 100. Isolation regions 103 separate first part 101 from second part 102. Isolation region 103 may comprise silicon dioxide, or other materials that may separate the transistor's active regions. First sacrificial layer 104 is formed on first high-k gate dielectric layer 105, and second sacrificial layer 106 is formed on second high-k gate dielectric layer 107. Hard masks 130, 131 are formed on sacrificial layers 104, 106.

After forming the FIG. 1 structure, spacers may be formed on opposite sides of sacrificial layers 104, 106. When those spacers comprise silicon nitride, they may be formed in the following way. First, a silicon nitride layer of substantially uniform thickness, for example, less than about 1000 Angstroms thick—is deposited over the entire structure, producing the structure shown in FIG. 2. Conventional deposition processes may be used to generate that structure.

In one embodiment, silicon nitride layer 134 is deposited directly on substrate 100 and opposite sides of sacrificial layers 104, 106—without first forming a buffer oxide layer on substrate 100 and layers 104, 106. In alternative embodiments, however, such a buffer oxide layer may be formed prior to forming layer 134. Similarly, although not shown in FIG. 2, a second oxide may be formed on layer 134 prior to etching that layer. If used, such an oxide may enable the subsequent silicon nitride etch step to generate an L-shaped spacer.

Figure 3:
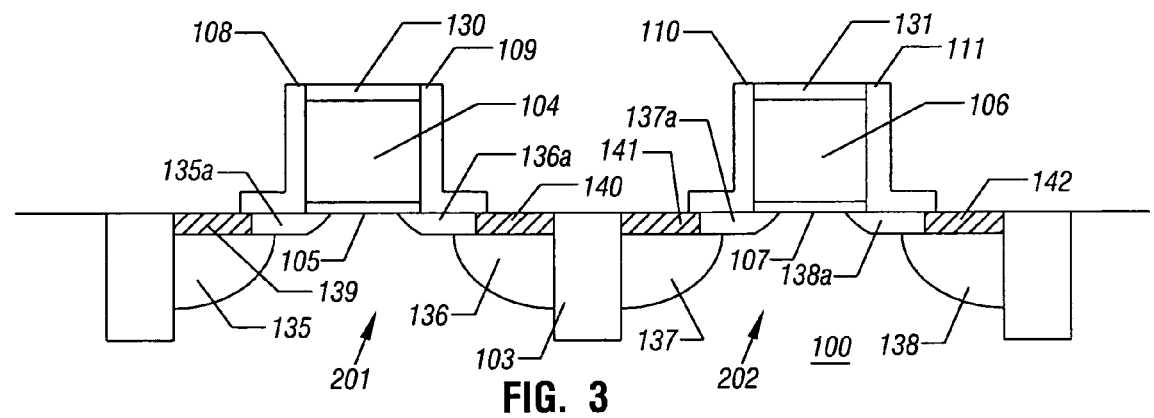

Silicon nitride layer 134 may be etched using a conventional process for anisotropically etching silicon nitride to create the FIG. 3 structure. As a result of that etch step, sacrificial layer 104 is bracketed by a pair of sidewall spacers 108, 109, and sacrificial layer 106 is bracketed by a pair of sidewall spacers 110, 111.

As is typically done, it may be desirable to perform multiple masking and ion implantation steps to create lightly implanted regions 135a–138a near layers 104, 106 (that will ultimately serve as tip regions for the device's source and drain regions), prior to forming spacers 108, 109, 110, 111 on sacrificial layers 104, 106. Also as is typically done, the source and drain regions 135–138 may be formed, after forming spacers 108, 109, 110, 111, by implanting ions into parts 201 and 202 of substrate 100, followed by applying an appropriate anneal step.

An ion implantation and anneal sequence used to form n-type source and drain regions within part 201 of substrate 100 may dope sacrificial layer 104 n-type at the same time. Similarly, an ion implantation and anneal sequence used to form p-type source and drain regions within part 202 of substrate 100 may dope sacrificial layer 106 p-type. When doping sacrificial layer 106 with boron, that layer should include that element at a sufficient concentration to ensure that a subsequent wet etch process, for removing n-type germanium containing layer 104, will not remove a significant amount of p-type sacrificial layer 106.

The anneal activates the dopants that were previously introduced into the source and drain regions and tip regions and into sacrificial layers 104, 106. In a preferred embodiment, a rapid thermal anneal is applied that takes place at a temperature that exceeds about 1,000° C.—and, optimally, that takes place at 1,080° C. In addition to activating the dopants, such an anneal may modify the molecular structure of high-k gate dielectric layers 105, 107 to create gate dielectric layers that may demonstrate improved performance.

Figure 4:
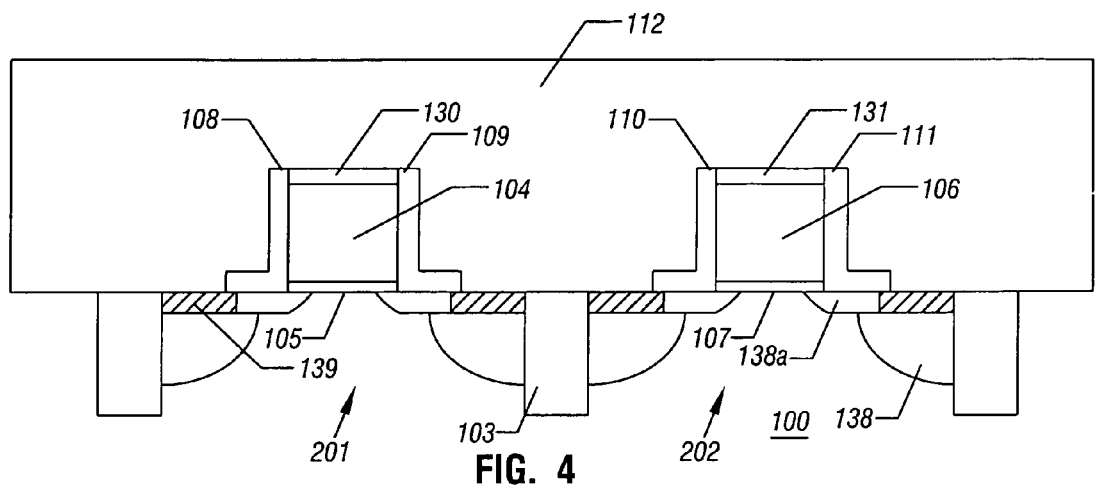

After forming spacers 108, 109, 110, 111, dielectric layer 112 may be deposited over the device, generating the FIG. 4 structure. Dielectric layer 112 may comprise silicon dioxide, or a low-k material. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Those source and drain regions may be formed by implanting ions into the substrate, then activating them. Alternatively, an epitaxial growth process may be used to form the source and drain regions, as will be apparent to those skilled in the art.

Commonly used nitride spacer, source/drain, and silicide formation techniques to make the FIG. 4 structure. That structure may include other features—not shown, so as not to obscure the method of the present invention—that may be formed using conventional process steps.

Figure 5:
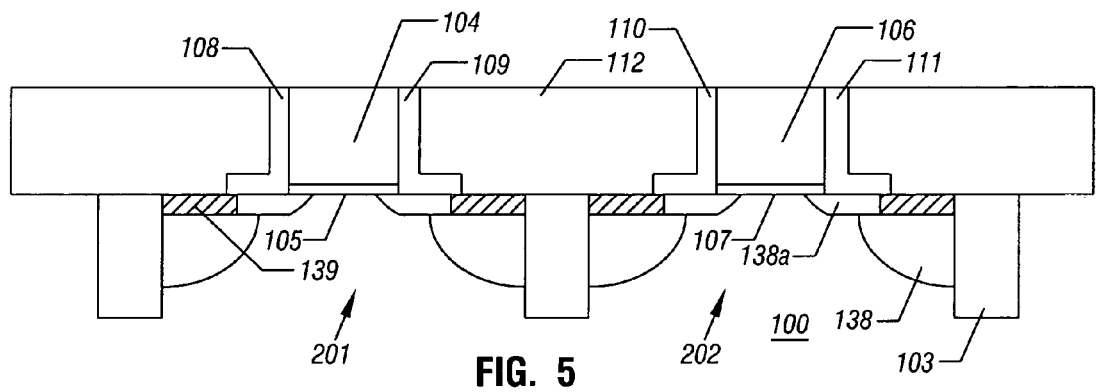

Dielectric layer 112 is removed from hard masks 130, 131, which are, in turn, removed from patterned sacrificial layers 104, 106, producing the FIG. 5 structure. A conventional chemical mechanical polishing ("CMP") operation may be applied to remove that part of dielectric layer 112 and hard masks 130, 131. Hard masks 130, 131 may be removed to expose patterned sacrificial layers 104, 106. Hard masks 130, 131 may be polished from the surface of layers 104, 106, when dielectric layer 112 is polished—as they will have served their purpose by that stage in the process.

Figure 6:
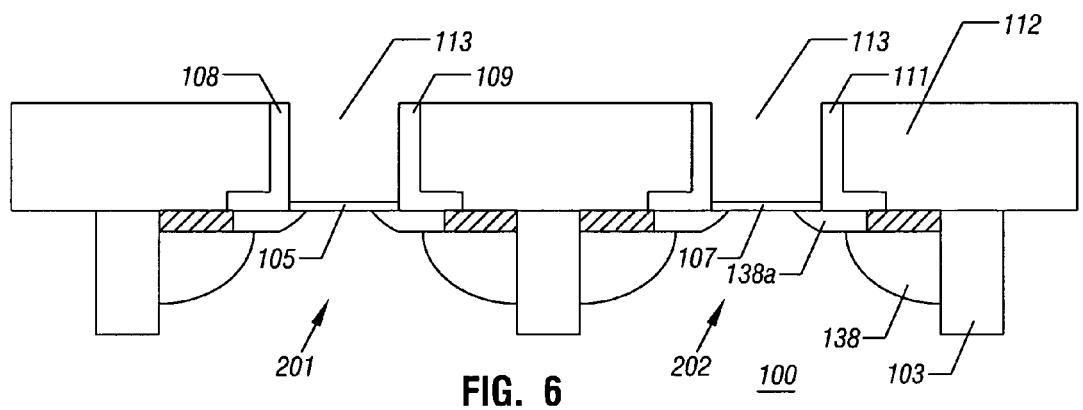

After forming the FIG. 5 structure, sacrificial layers 104 or 106 are removed to generate trenches 113, producing the structure shown in FIG. 6. A 1% solution of HF may be used for 15 to 30 seconds to remove the chemical oxide formed over the remaining polysilicon.

In a second embodiment (not shown), a wet etch process that is selective for layers 104 over layers 106 is applied to remove layers 104 without removing significant portions of layers 106. When sacrificial layer 104 is doped n-type, and sacrificial layer 106 is doped p-type (e.g., with boron), such a wet etch process may comprise exposing sacrificial layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water. Any remaining sacrificial layer 104 may be selectively removed by exposing it to a solution, which is maintained at a temperature between about 15° C. and about 90° C. (for example, below about 40° C.), that comprises between about 2 and about 30 percent ammonium hydroxide by volume in deionized water. During that exposure step, which preferably lasts at least one minute, it may be desirable to apply sonic energy at a frequency of between about 10 kHz and about 2,000 kHz, while dissipating at between about 1 and about 10 Watts/cm$^2$.

In the second embodiment, sacrificial layer 104, with a thickness of about 1,350 Angstroms, may be selectively removed by exposing it at about 25° C. for about 30 minutes to a solution that comprises about 15 percent ammonium hydroxide by volume in deionized water, while applying sonic energy at about 1,000 kHz—dissipating at about 5 Watts/cm$^2$. Such an etch process should remove substantially all of an n-type sacrificial layer without removing a meaningful amount of a p-type sacrificial layer.

As a third embodiment, sacrificial layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial layer 104, with a thickness of about 1,350 Angstroms, by exposing it at about 80° C. for about 2 minutes to a solution that comprises about 25 percent TMAH by volume in deionized water, while applying sonic energy at about 1,000 kHz—dissipating at about 5 Watts/cm$^2$—may remove substantially all of layer 104 without removing a significant amount of layer 106. First high-k gate dielectric layer 105 should be sufficiently thick to prevent the etchant that is applied to remove sacrificial layer 104 from reaching the channel region that is located beneath first high-k gate dielectric layer 105.

In some embodiments, a dielectric layer 105 and/or 107 may be removed before forming a replacement metal gate. In such case, a metal oxide gate dielectric may be formed before forming the replacement gate.

Figure 7:
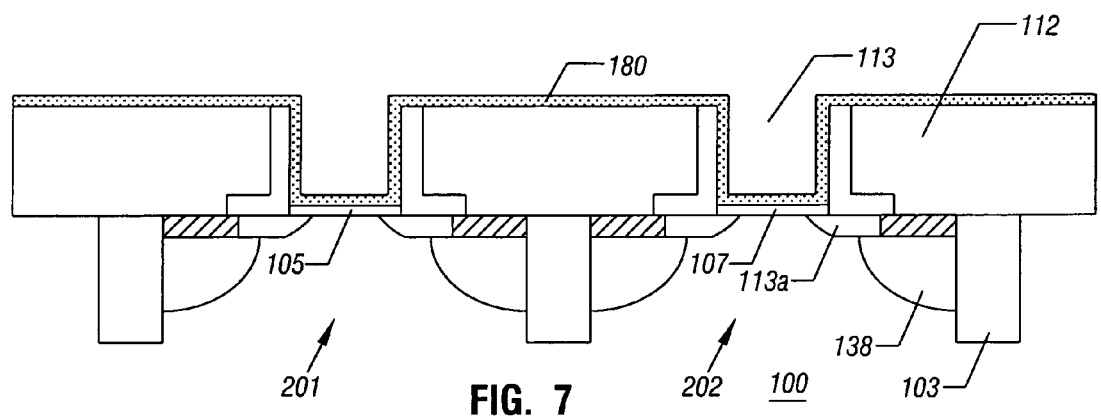

In the illustrated embodiment, a nucleation layer 180 is formed directly on layers 105 and in the trenches 113 to generate the FIG. 7 structure. The layer 180 may be formed by surface activating with catalytic metal, such as palladium, palladium salt, palladium chloride, self-assembled monolayers (SAM) of palladium containing organic chemicals such alkenes or azole silane. The surface activation may be followed by electroless deposition of a seed layer such as palladium, platinum, ruthenium, zirconium, cobalt, or nickel from solutions containing metal ions, complexing agents such as carboxylic acid, buffer agents such as boric acid, reducing agents such as hypophosphite, dimethylaminoborane (DMAB), formaldehyde, or hydrazine. The seed layer can be deposited by ALD, PVD, or CVD, using n-type and p-type gate electrode materials. The thickness of the nucleation layer 180 may be less than 10 nanometers in some embodiments.

Figure 8:
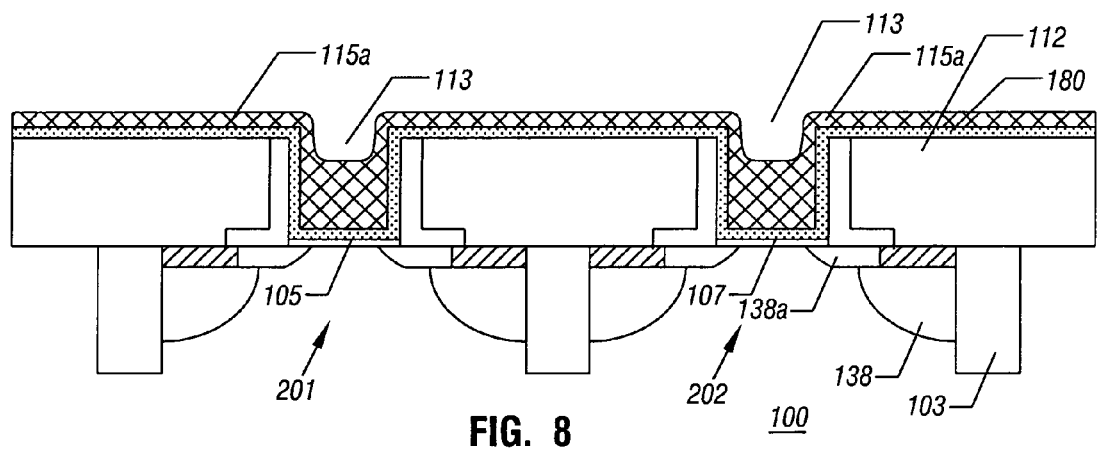
Figure 9:
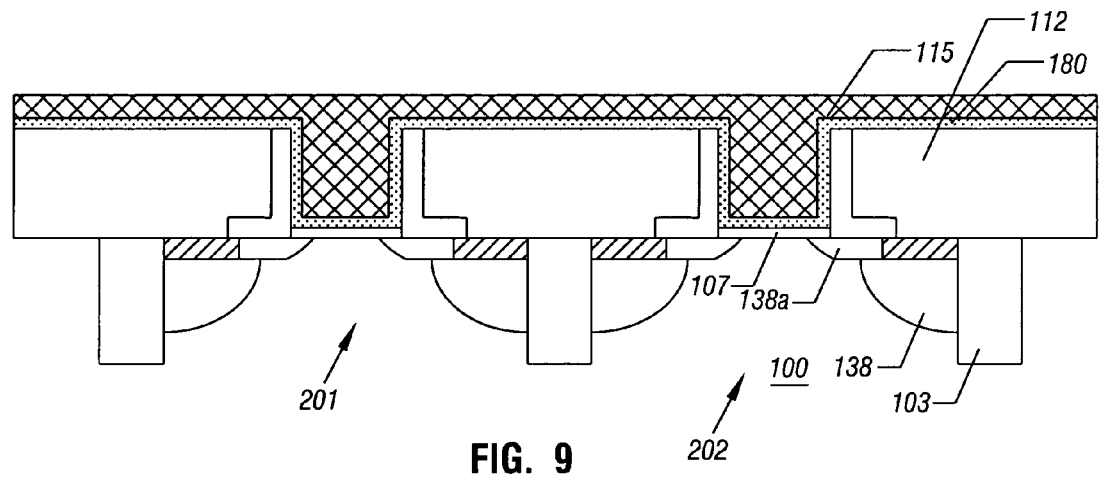
Figure 10:
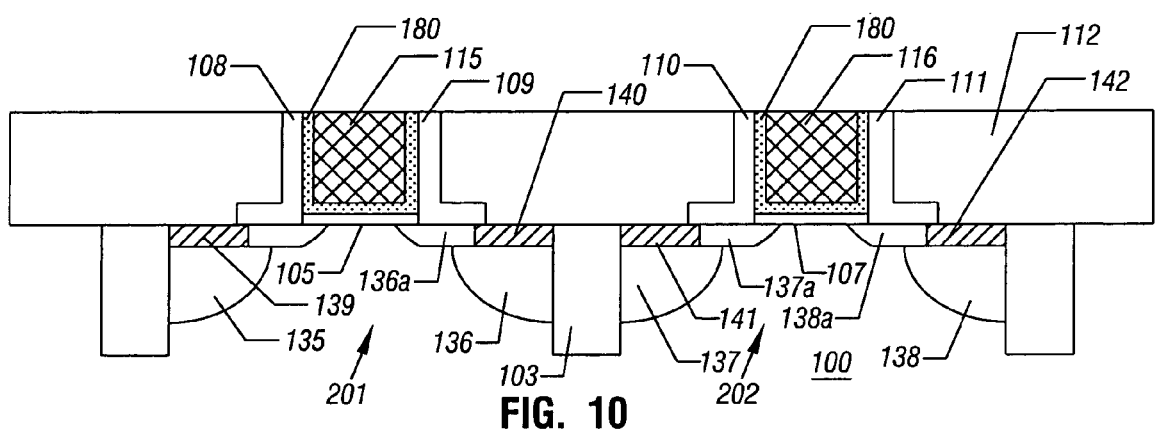

Referring to FIG. 8, after formation of the nucleation layer 180, a contact/gap fill can be implemented by applying a bottom up superconformal filling (superfill) using electroplating. The gap fill materials may include zirconium, lead, platinum, ruthenium, cobalt, or nickel. The electroplating solutions can contain metal ions, base, such as TMAH or NH$_4$OH or acid, such as H$_2$SO$_4$ or methanesulfonic acid (MSA) to provide electrolyte conductivity, and accelerators such as a disulfide. The accelerator may be accumulated in the small features at the bottom surface due to rapid reduction in surface area during plating providing bottom up fill. Sonication may be utilized to aid in gap fill. The completed superfill is shown in FIG. 9. After chemical mechanical planarization (CMP), the structure of FIG. 10 results.

Suitable materials for the layers 115a and 115 include, for n-type material, tantalum, hafnium, zirconium, titanium, scandium, or aluminum. Suitable materials for the layers 116a and 116, for p-type gate material, include tungsten, molybdenum, nickel, platinum, ruthenium, or palladium.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pair of trenches in an insulator;
   forming a metal oxide gate dielectric in said trenches; and
   filling said trenches with metal using bottom up superconformal filling to form metal gate electrodes.

2. The method of claim 1 including filling each of said trenches with a different metal.

3. The method of claim 2 including forming n-type and p-type gate electrodes by filling with metal.

4. The method of claim 1 including applying a seed layer before superconformal filling said trenches.

5. The method of claim 1 including activating the surfaces of said trenches with a catalytic metal.

6. The method of claim 5 including activating said surfaces with a catalytic metal including palladium.

7. The method of claim 5 including depositing a seed layer on said activated surface.

8. The method of claim 7 including forming a seed layer less than 10 nanometers thick.

9. The method of claim 1 including using sonication during superconformal filling.

10. The method of claim 1 including filling with an electroplating solution including an electrolyte conductivity enhancer and an accelerator.

11. A method of forming a replacement metal gate comprising:
    activating the surface of a trench in an insulator with a catalytic metal;
    depositing a seed layer on said activated surface; and
    filling said trench using bottom up superconformal filling to form a metal gate electrode.

12. The method of claim 11 including forming a pair of trenches and filling each of said trenches with a different metal.

13. The method of claim 12 including forming one trench with an n-type metal and the other trench with a p-type metal.

14. The method of claim 11 including activating said surface with a catalytic metal including palladium.

15. The method of claim 11 including using sonication during superconformal filling.

16. The method of claim 1 including using an electroplating solution for filling said trenches that includes an electrolyte conductivity enhancer and an accelerator.

17. A method comprising:
forming a pair of trenches in an insulator;
activating the surfaces of said trenches with a catalytic metal;
depositing a seed layer on said activated surface;
forming a metal oxide gate dielectric in said trenches and on said seed layer; and
filling said trenches with metal using bottom up superconformal filling to form metal gate electrodes.

18. The method of claim 17 including filling each of said trenches with a different metal.

19. The method of claim 18 including forming n-type and p-type gate electrodes by filling with metal.

20. The method of claim 17 including activating said surfaces with a catalytic metal including palladium.

* * * * *